(12) United States Patent
Aramaki et al.

(10) Patent No.: US 7,947,189 B2
(45) Date of Patent: May 24, 2011

(54) VACUUM PROCESSING APPARATUS AND VACUUM PROCESSING METHOD OF SAMPLE

(75) Inventors: Tooru Aramaki, Kudamatsu (JP);
Tsunehiko Tsubone, Hikari (JP);
Tadamitsu Kanekiyo, Kudamatsu (JP);
Shigeru Shirayone, Shuunan (JP);
Hideki Kihara, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1057 days.

(21) Appl. No.: 11/696,922

(22) Filed: Apr. 5, 2007

(65) Prior Publication Data

US 2007/0170149 A1 Jul. 26, 2007

Related U.S. Application Data

(62) Division of application No. 11/213,736, filed on Aug. 30, 2005, now abandoned.

(30) Foreign Application Priority Data

Apr. 20, 2005 (JP) ................................ 2005-122001

(51) Int. Cl.
*C03C 25/68* (2006.01)
*H01L 21/461* (2006.01)
*C23F 1/00* (2006.01)

(52) U.S. Cl. ..... 216/58; 216/67; 438/706; 257/E21.252; 257/E21.257; 257/E21.577; 257/E21.579

(58) Field of Classification Search .................. None
See application file for complete search history.

(56) References Cited

U.S. PATENT DOCUMENTS

| | | | |
|---|---|---|---|
| 5,660,047 A * | 8/1997 | Paganessi | 62/64 |
| 5,673,750 A * | 10/1997 | Tsubone et al. | 165/275 |
| 5,810,933 A * | 9/1998 | Mountsier et al. | 118/724 |
| 5,835,334 A * | 11/1998 | McMillin et al. | 361/234 |
| 5,968,847 A * | 10/1999 | Ye et al. | 438/734 |
| 6,500,681 B1 * | 12/2002 | Christian et al. | 438/8 |
| 6,534,416 B1 * | 3/2003 | Ye et al. | 438/714 |
| 6,547,559 B1 * | 4/2003 | Hodos | 432/253 |
| 6,946,387 B2 * | 9/2005 | Wada et al. | 438/629 |
| 7,179,663 B2 * | 2/2007 | Chang | 438/14 |
| 7,402,517 B2 * | 7/2008 | Yonker et al. | 438/674 |
| 7,667,301 B2 * | 2/2010 | Nakamura et al. | 257/633 |
| 2002/0067585 A1 * | 6/2002 | Fujiwara | 361/234 |

(Continued)

FOREIGN PATENT DOCUMENTS

| | | |
|---|---|---|
| JP | 63-274147 | 11/1988 |
| JP | 07-249586 | 9/1995 |
| JP | 09-097786 | 4/1997 |
| JP | 11-097516 | 4/1999 |
| JP | 2003-100718 | 4/2003 |
| JP | 2003-234326 | 8/2003 |

*Primary Examiner* — Allan Olsen
(74) *Attorney, Agent, or Firm* — Antonelli, Terry, Stout & Kraus, LLP.

(57) ABSTRACT

A vacuum processing method includes mounting a sample to be processed on a sample mounting surface on a sample holder placed in a vacuum container whose inside can be depressurized, feeding a processing gas and electric field to a space above the sample holder inside of the vacuum container to generate plasma, and etching films of a plurality of layers laid over the surface of the sample into a predetermined shape. A heat conducting gas is fed between the sample mounting surface and the backside of the sample, and at the same time, the pressure of the heat conducting gas is changed stepwise in accordance with the progress of the processing of the films of a plurality of layers of the sample.

8 Claims, 11 Drawing Sheets

U.S. PATENT DOCUMENTS

| | | | |
|---|---|---|---|
| 2002/0192938 A1* | 12/2002 | Wada et al. | 438/618 |
| 2004/0196616 A1* | 10/2004 | Koo et al. | 361/254 |
| 2004/0247787 A1* | 12/2004 | Mackie et al. | 427/248.1 |
| 2005/0284571 A1* | 12/2005 | Negishi et al. | 156/345.28 |
| 2006/0223312 A1* | 10/2006 | Yonker et al. | 438/674 |
| 2007/0009649 A1* | 1/2007 | Nakamura et al. | 427/8 |
| 2008/0170969 A1* | 7/2008 | Yoshioka et al. | 422/109 |
| 2008/0245304 A1* | 10/2008 | Yonker et al. | 118/725 |
| 2009/0000741 A1* | 1/2009 | Aramaki et al. | 156/345.33 |
| 2009/0181545 A1* | 7/2009 | Negishi et al. | 438/710 |
| 2010/0055879 A1* | 3/2010 | Harano et al. | 438/466 |

* cited by examiner

FIG. 8(a)    FIG. 8(b)
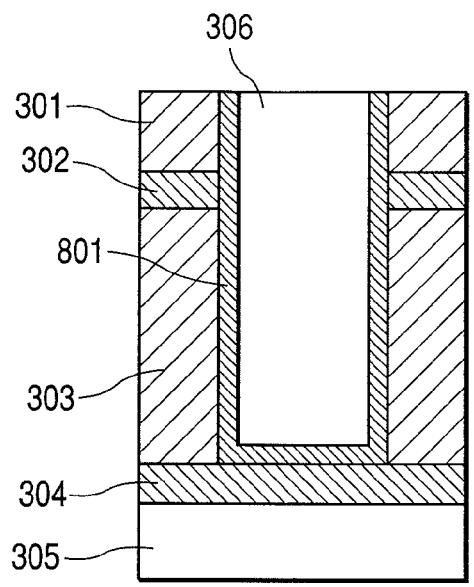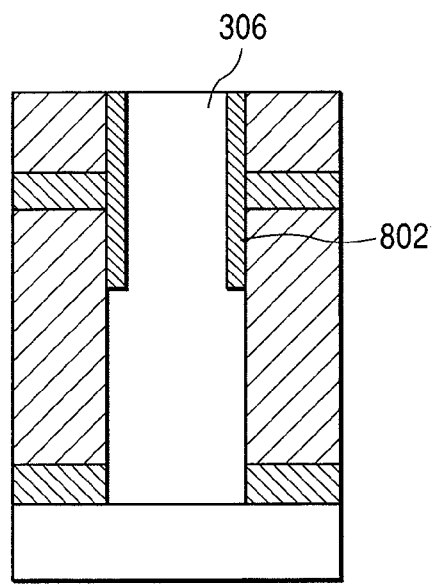
FIG. 9
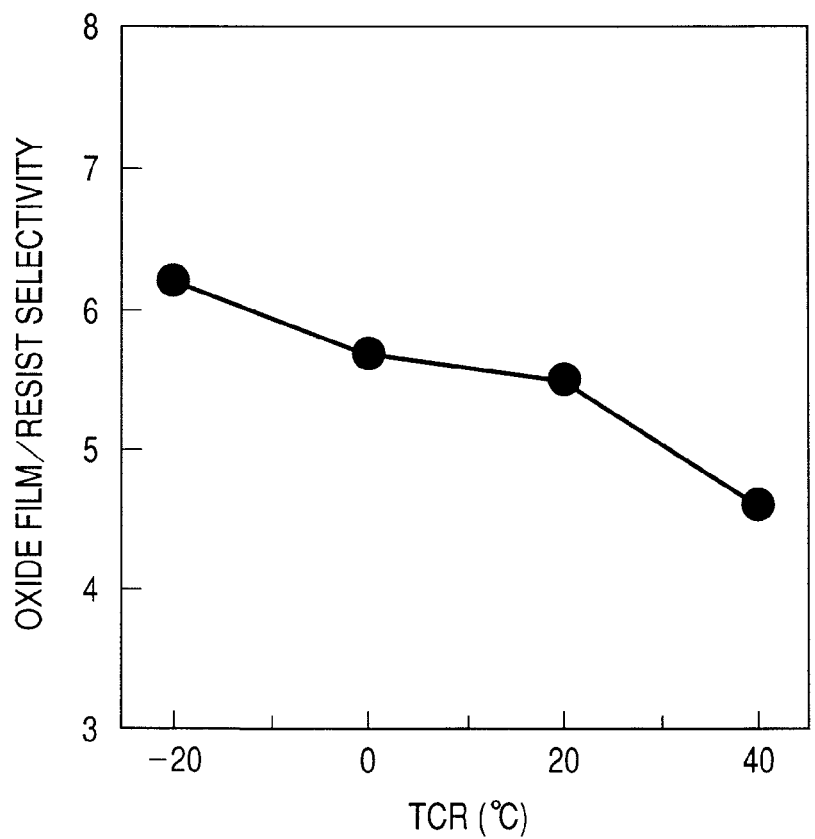

VACUUM PROCESSING APPARATUS AND VACUUM PROCESSING METHOD OF SAMPLE

CROSS REFERENCE TO RELATED APPLICATION

This application is a divisional application of U.S. application Ser. No. 11/213,736, filed Aug. 30, 2005, now abandoned, the contents of which are incorporated herein by reference.

CLAIM OF PRIORITY

The present application claims priority from Japanese application serial JP 2005-122001 filed on Apr. 20, 2005, the content of which is hereby incorporated by reference into this application.

FIELD OF THE INVENTION

The present invention relates to a vacuum processing apparatus for processing a sample such as semiconductor wafer in a pressure-reduced container and a vacuum processing method of the sample. In particular, the invention pertains to a vacuum processing apparatus for processing a sample while feeding the backside of a sample mounted on a sample holder in a container with a heat conducting gas for adjusting the heat transfer between the sample and the sample holder, and a vacuum processing method of the sample.

BACKGROUND OF THE INVENTION

A vacuum processing apparatus for processing a substrate, which is a sample to be processed such as a semiconductor wafer, placed in a vacuum container having an inside capable of being evacuated to high vacuum with plasma generated using a processing gas fed into the vacuum container which has been evacuated to vacuum, and an electric field or magnetic field has been utilized for highly fine processing of a semiconductor device and the like.

A typical example of such processing is etching of thin films constituting a plurality of layers formed on the surface of a substrate by lithography. By this etching, a portion of the thin film which has remained uncovered with a mask such as photoresist formed over the upper surface of this thin film is removed (etched) using highly reactive particles or ions formed in plasma.

Since there is a demand for semiconductor elements obtained by such processing to have higher precision and higher density, more minute and higher precision processing is requested. As a result, processing into a shape with smaller width, especially etching into a trench with a smaller width is required. A technology to increase a so-called aspect ratio of a trench, that is, a ratio of the depth of the trench relative to its width which is an indicator of the characteristic of the cross-sectional shape of the trench becomes necessary.

In order to actualize a high aspect ratio of a trench with high precision when minute processing is carried out, it becomes necessary to differentiate the processing property or processing rate depending on the processing direction, in other words, to heighten anisotropy of the processing or to employ an appropriate selectivity, which is a ratio of the processing property between a member to be processed and another member.

With a view to satisfying such a request, a technology to process a surface of a shape, such as trench, to be processed in a specific direction (bottom surface, lower surface) while covering its side surface with a substance other than that to be processed has been developed. As such a substance covering a side wall therewith, a hydrocarbon-containing resin formed by polymerization in plasma in a vacuum container or a product in plasma such as carbon fluoride is used. By depositing these substances to the surface of a film to be processed, thereby covering the surface therewith and, at the same time, by applying bias voltage to a substrate to introduce ions in plasma to the surface of the substrate in a substantially vertical direction, processing is caused to advance into the bottom direction of a trench while protecting the side wall of the trench from particles of a reactive substance.

On the other hand, the formation of a protecting film on the side wall owes mainly to the deposition of a reaction product so that its formation greatly depends on the distribution of the reaction product. The distribution of the reaction product in a processing chamber inside of a vacuum container is not always uniform so that without any device, the formation of the protecting film on the side wall becomes uneven in the in-plane direction of the substrate, which may damage the uniformity of the processed shape remarkably.

The deposition of such a reaction product on the substrate surface is influenced largely by the temperature on the substrate surface. A technology to appropriately adjust the temperature of the substrate in the plane direction and provide suitable distribution of the protecting film on the side wall, thereby making the processed shape more uniform is known.

As such a conventional art, those disclosed in Japanese Patent Laid-Open Nos. H7 (1995)-249586 and H11 (1999)-97516 are known.

In the former document, disclosed is a processing apparatus for adjusting the temperature of a wafer by feeding a heat conducting He gas between a semiconductor wafer which is to be processed and the surface of a lower electrode on which the wafer is to be mounted, adjusting the pressure of the He gas, and adjusting the calorie transferred to the surface of the lower electrode from the wafer. Particularly, disclosed in this document is a processing apparatus equipped with a supply and exhaust unit and a pressure control mechanism for feeding a heat conducting gas to the outer circumferential side and center side of the lower electrode respectively in order to adjust the temperature of the wafer to be uniform without causing cooling unevenness.

In the latter document, on the other hand, disclosed is an apparatus equipped with a heat conducting He gas feed pipe, a bypass pipe for communicating the above-described pipe and a processing chamber existing at the outer circumference of a lower electrode on which a wafer is retained by electrostatic adsorption, and an open valve placed over this bypass pipe, which apparatus, when a power supply is blocked by some accident to preclude adsorption of the wafer, can retain the wafer on the electrode, because the valve is opened to cause a heat conducting gas to escape into a processing chamber.

The above-described conventional arts lack considerations on the below-described points and therefore cause some inconveniences.

When films constituting a plurality of layers are processed and first processing is switched to second processing during two films are in the desired form, a rapid change in temperature is necessary when different temperature conditions are employed before and after the processing. It takes much time to change the temperature in the conventional art. During this change, it is therefore necessary to terminate the processing or retard the processing rate. This causes a reduction in the processing efficiency. Alternatively, owing to excessive processing during a temperature change, the processed shape may be far different from the desired one.

In particular, on the interface between two different film layers, switch-over in a shorter time is required when the underlying layer is exposed. If not so, the underlying film is etched too much or the processed shape becomes an undesired one because processing is not conducted under predetermined conditions until variations in the conditions stop and switch-over is completed.

If the etching of the underlying film is suppressed by a reduction in the processing rate during the exposure of the underlying film or in advance thereof in order to avoid the above-described problem, time necessary for the whole processing increases, which may lead to a reduction in the processing efficiency or throughput.

When the processing conditions are different or materials for respective film layers are different, changes in processing characteristics such as selectivity in a short time are required. The above-described conventional arts do not however include consideration on the technology to actualize such processing.

SUMMARY OF THE INVENTION

An object of the present invention is to provide a vacuum processing apparatus or processing method, which is, when films of a plurality of layers are etched into a predetermined shape, capable of eliminating a deficiency in the shape in sample processing, increasing an aspect ratio of the processed shape and providing a more precise shape.

Another object of the present invention is to provide a vacuum processing apparatus or vacuum processing method, which is, when films of a plurality of layers are etched into a predetermined shape, capable of improving the through put of processing, thereby carrying out the processing at a high efficiency.

The above-described objects can be attained by a vacuum processing apparatus comprising a vacuum container the inside of which can be depressurized and a sample holder which is located inside of the vacuum container to place thereon a sample to be processed; used for etching of films constituting a plurality of layers and laid over the surface of the sample into a predetermined shape while using plasma generated by an electric field and a processing gas fed to a space above the sample holder inside of the vacuum container; and equipped with a heat conducting gas feed unit for feeding a heat conducting gas between the sample mounting surface of the sample holder and the backside of the sample, wherein:

the apparatus is equipped further with a pressure controlling unit for feeding the heat conducting gas for changing stepwise the pressure of the heat conducting gas fed between the sample mounting surface and the backside of the sample in accordance with the progress of the processing of the films constituting a plurality of layers of the sample.

The object can also be attained by the above-described vacuum processing apparatus, wherein the pressure control unit of reducing the pressure stepwise when the processing reaches the vicinity of the interface between the films of a plurality of layers. The object can also be attained by the above-described vacuum processing apparatus wherein the pressure control unit is equipped further with a valve which is placed on an exhaust channel, communicated with an introduction channel for feeding the heat conducting gas onto the sample mounting surface and serving to discharge the heat conducting gas from the introduction channel, and whose opening degree can be controlled stepwise.

The opening degree of the valve can be controlled by the switch-over between a closed state and an open state during processing.

The object can also be attained by the above-described vacuum processing apparatus equipped further with a heat conducting gas passage which is communicated with the introduction channel and has a controller for controlling the pressure of the heat conducting gas to a desired value during the processing.

The above-described object can also be attained by a vacuum processing method comprising the steps of: mounting a sample to be processed on a sample holder placed in a vacuum container whose inside can be reduced in pressure; feeding a processing gas and electric field to a space above the sample holder inside of the vacuum container to generate plasma; and etching films constituting a plurality of layers laid over the surface of the sample into a predetermined shape, wherein the pressure of a heat conducting gas to be fed between a sample mounting surface of the sample holder on which the sample is mounted thereon and the backside of the sample is changed stepwise in accordance with the progress of the processing of the film of a plurality of layers. The above-described object can also be attained by changing stepwise the pressure when the processing reaches the vicinity of the interface between the films constituting a plurality of layers.

The above-described object canal so be attained by a vacuum processing method comprising the steps of: mounting a sample to be processed on a sample holder placed in a vacuum container whose inside can be reduced in pressure; feeding a processing gas and electric field to a space above the sample holder inside of the vacuum container to generate plasma; and etching films constituting a plurality of layers laid over the backside of the sample into a predetermined shape, wherein the amount of a heat conducting gas, which is fed between a sample mounting surface placed on the sample holder and having the sample mounted thereon and the backside of the sample, discharged from the middle of its feed channel is increased stepwise during the processing.

When films of a plurality of layers are etched into a predetermined shape, the present invention makes it possible to control the shape of a sample with high precision, eliminate a deficiency in shape formed by sample processing, and increase the aspect ratio of the processed shape. When films of a plurality of layers are etched into a predetermined shape, the present invention is also effective for improving the through put of processing.

BRIEF DESCRIPTION OF DRAWINGS

FIGS. 8A and 8B are explanatory views of the operation according to the one example of the present invention;

FIG. 9 is a schematic view illustrating the temperature dependence of the processed shape according to the one example of the present invention;

DETAILED DESCRIPTION OF PREFERRED EMBODIMENTS

First Example

First example of the present invention will hereinafter be described with reference to FIGS. 1 to 10.

Figure 1:
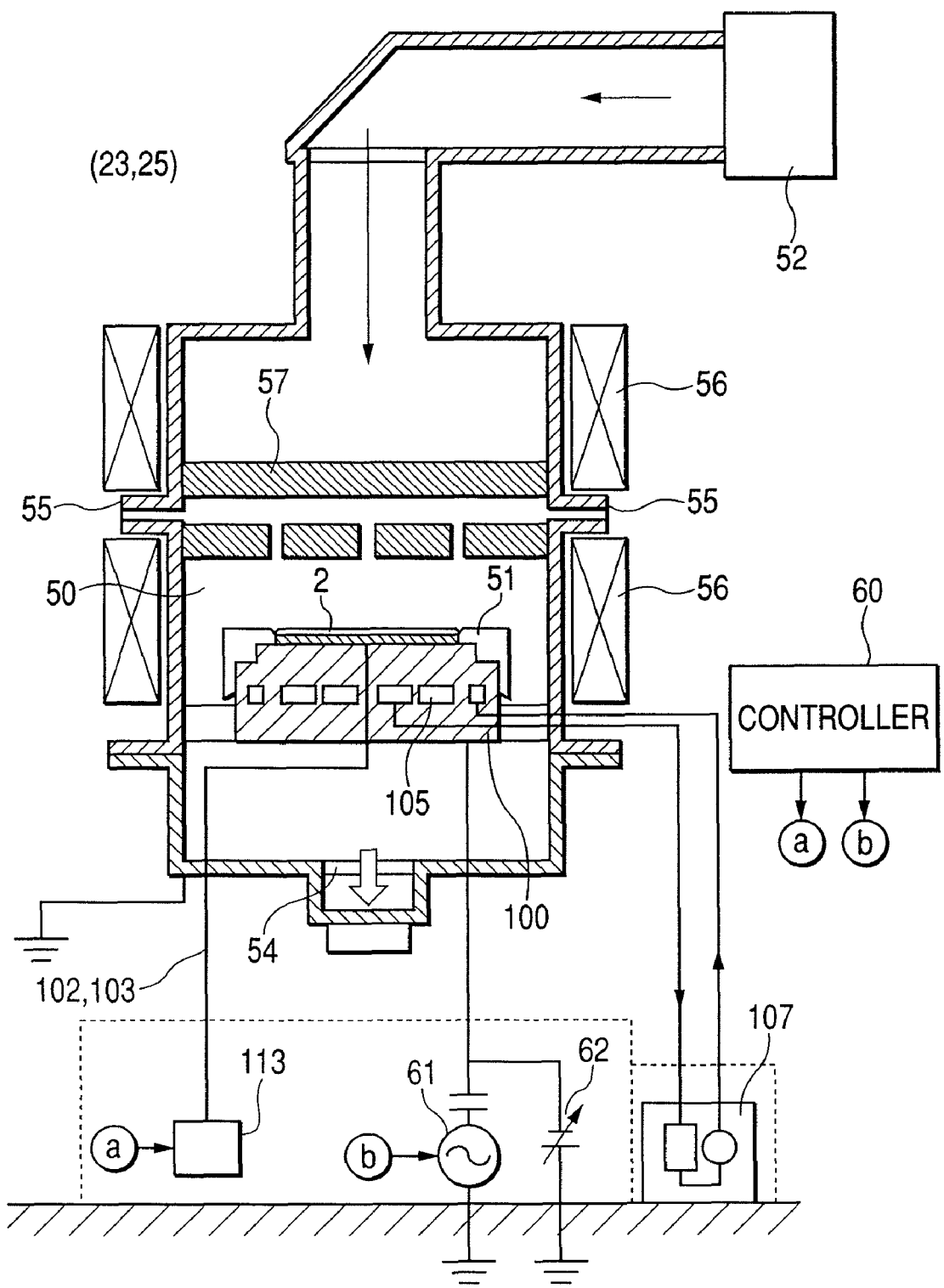
FIG. 1 is a schematic view of a plasma processing apparatus using a sample holder according to one example of the present invention.

The constitution example of a plasma etching apparatus to which the present invention has been applied will next be described based on FIGS. 1 and 2. In FIG. 1, the processing unit 23 or 25 of the plasma etching apparatus is equipped with a processing chamber 50 which has, inside thereof, a stage 51 including a sample holder 100 on which a sample 2 to be etched is mounted. A processing gas is fed from a processing gas inlet 55 into the processing chamber 50. Inside of the processing chamber 50, the processing gas is fed to a flat-shaped dispersion plate from a gas feeder and, it is dispersed into the processing chamber 50 through a plurality of penetration holes. Indicated at numeral 52 is an electromagnetic source for an electromagnetic wave radiation unit. An electromagnetic wave irradiated from this electromagnetic source is introduced into the processing chamber 50 and irradiated to the processing gas, whereby plasma for processing therewith the sample is generated in the chamber 50. The electromagnetic wave from this electromagnetic source 52 is propagated through a waveguide and then, irradiated in the processing chamber. A controller 60 serves to control the whole operation of the plasma etching apparatus including the electromagnetic source 52 and gas feeder. Particularly in this example, the apparatus is equipped with a heat-conducting-gas pressure control unit for controlling the pressure of a heat conducting gas or a substrate bias control unit for controlling the bias of a substrate. In addition, the apparatus is also equipped with a unit of changing the etching conditions depending on the conditions of the substrate surface detected by an etching terminal point detector, or the progress of etching of a sample judged based on the etching time. Owing to such units or functions, the apparatus of this example can carry out etching with a high aspect ratio and high throughput as described later.

In this example, the electromagnetic source 52 is that of a microwave or UHF-band electromagnetic wave. Three coils 56 are placed around a space above the sample holder 100 in the processing chamber 50 in which plasma 53 is generated. The distribution of a plasma density in the chamber is adjusted by a magnetic field fed to the space from these coils 56.

Inside of the sample holder 100, a plurality of passages 105 through which a refrigerant for adjusting the temperature of the sample holder 100 passes are placed. Moreover, a plurality of openings through which a heat conducting gas having high heat transfer property for promoting heat transfer between the backside of the sample 2, that is, the surface of the sample which is brought into contact with the sample holder 100 and the surface of the sample holder 100, and in communication with each of these openings, a plurality of gas passages, for example, two ring-shaped recesses through which a heat conducting gas flows are placed. Described specifically, over the stage 51 whose temperature has been set, the sample 2 is laid and retained by electrostatic suction. From heat conducting gas supply channels 102 and 103, a heat conducting gas, for example, He is fed to each of the two ring-shaped recesses on the backside of the sample 2. The pressure of the heat conducting gas to be fed to each recess can be controlled to a desired pressure by controlling a sequencer 113 according to a control signal (a) provided by a controller 60. In short, the apparatus of this example has, as a heat-conducting-gas pressure control unit or function, a pressure control unit such as stepwise reduction of the pressure of a heat conducting gas fed to the recess between the sample mounting surface and the backside of the sample in accordance with the progress of the processing of the film of a plurality of layers when the processing reaches the vicinity of the interface between the films of a plurality of layers. Each of these recesses also has a pressure control unit or function. The apparatus of this example is equipped with an introduction channel for feeding the heat conducting gas to each recess between the sample mounting surface and the backside of the sample, an exhaust channel communicated with the introduction channel and serves to discharge the heat conducting gas from this introduction channel, a valve placed over the exhaust channel and the sequencer 113 for controlling the opening degree of this valve stepwise. The sequencer 113 controls the opening degree of the valve stepwise, thereby controlling the pressure.

The sample holder 100 constitutes a substrate electrode. This electrode is connected to a high-frequency substrate bias power source 61 via a rectifier. Processing with plasma is promoted by applying a bias to the substrate to attract charged particles to the surface of the plasma from the inside thereof and, reacting the particles excited to high energy levels in the plasma with the surface of the sample. The oscillation of this substrate bias power source 61 can be controlled by external trigger signals and it is controlled by the substrate bias control unit of the controller 60. If necessary, the amount of the substrate bias is adjusted depending on the progress of the processing of the sample, that is, the progress from main etching to overetching by control signal (b) provided by the substrate bias control unit.

For the electrostatic adsorption of the sample 2, an electrostatic chuck power source 62 is connected to the substrate electrode via a filter. In an electrostatic adsorption apparatus, by applying potentials opposite to each other to conductive plates respectively, charges opposite to each other are induced in the sample plane, whereby an electrostatic adsorption power appears and adsorption occurs. Electricity may be removed by applying a potential opposite to that applied first to the conductive plate. In this manner, the sample 2 can be cooled depending on the temperature distribution of the stage. By the electrostatic chuck (ESC), the sample is electrostatically adsorbed at the entire circumference thereof so as to prevent leakage of an He gas to the etching chamber from the vicinity of the outer circumferential portion of the sample and at the same time, it is partially adsorbed so as to prevent uplift of the center portion of the sample which will otherwise occur by the pressure of the heat conducting gas.

In this example, by the electromagnetic radiation unit, magnetic field supply unit or the like, a processing gas fed into the processing chamber 50 acquires high energy levels, and plasma is generated in the space above the sample 2 above the processing chamber 50 and diffused into the processing chamber 50 surrounded by the dispersion plate and the side walls of the processing chamber 50. The sample 2 is processed by reacting the surface thereof with ions or high energy particles in the plasma thus generated. The reaction products formed by the reaction between the sample, dispersion plate, or member of the side wall of the processing chamber and particles in the plasma are, together with the particles in the plasma which have not contributed to the above-described reaction or processing of the sample, discharged outside the processing chamber 50 from an exhaust port 54 disposed below the sample holder 100 by a vacuum pump (not illustrated) connected to the exhaust port.

There are various plasma generation sources such as capacitive coupling system, induction coupling system, and ECR system using a microwave or UHF wave. The present invention is not limited to a specific plasma generation system.

Figure 2:
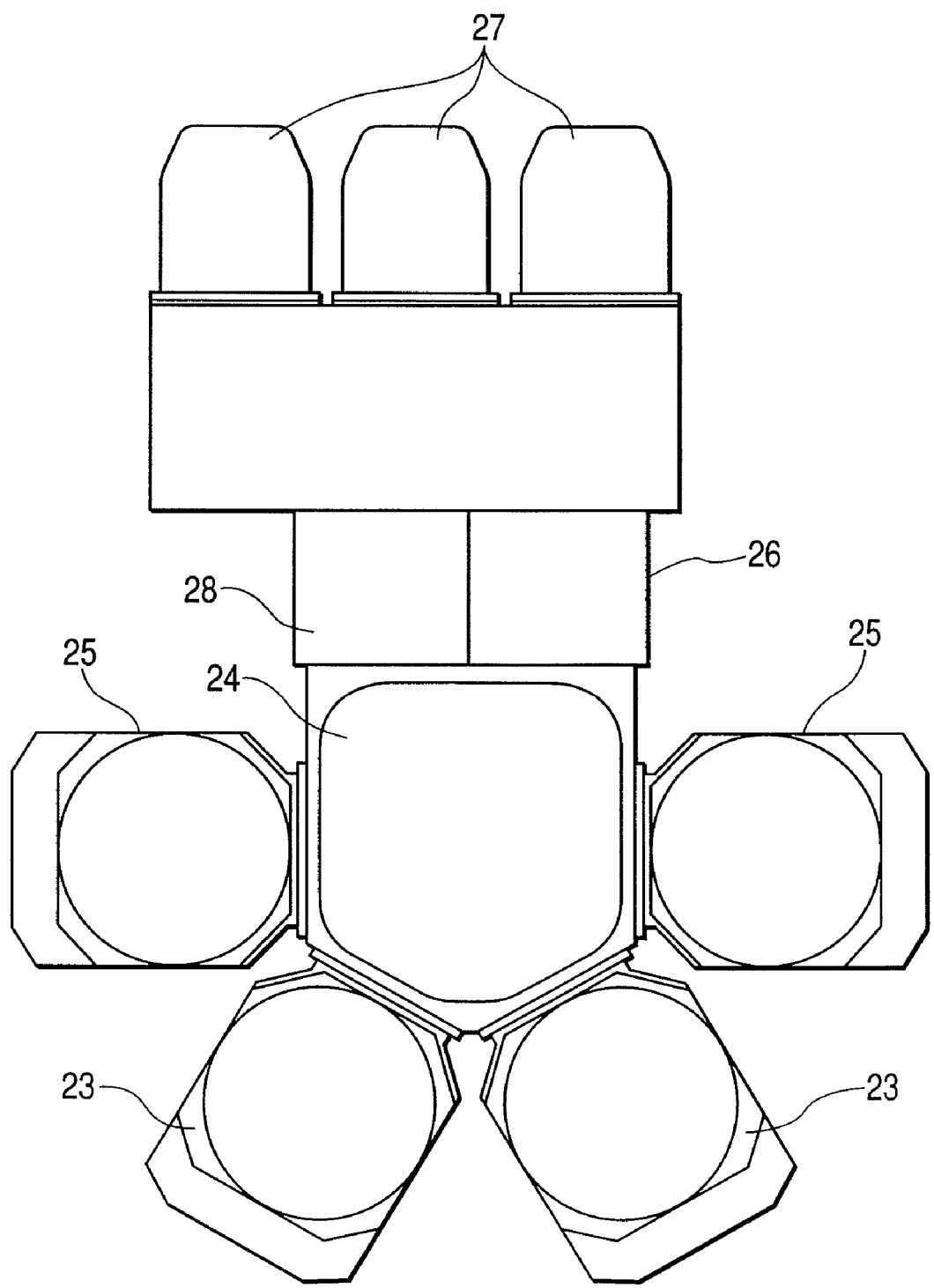
FIG. 2 illustrates one example of the entire arrangement of a plasma processing apparatus to which the present invention has been applied.

FIG. 2 illustrates an example of a plasma processing apparatus equipped with the processing units 23 and 25 of FIG. 1. The plasma processing apparatus shown in this example can roughly be divided into an atmospheric block and a processing block. The atmospheric block has a plurality of cassettes 27 having stored therein the sample 2 to be processed and dummy wafer used for cleaning, and a robot arm for carrying the sample 2 or dummy wafer between the cassette 27 and the processing block. In the processing block, on the other hand, processing units 23 and 25, a carrier unit 24 which can be hermetically sealed and therefore can carry the sample 2 under reduced pressure, and lock chambers 26 and 28 in which the sample 2 before or after processing is stored and it is delivered from the atmospheric block or removed from the lock chamber by reducing the pressure to that of the carrier unit 24 or raised to substantially atmospheric pressure.

The plasma processing apparatus has a plurality of the processing units 23 and 25, each equipped with the processing chamber 50. In this example, the processing chamber of the unit 23 is for etching, while that of the unit 25 is for ashing.

The above-described processing units each has the controller 60 (unit controller) for controlling the operation of each processing. The controller 60 typically has a microcomputer and by using it, sends or receives signals for directing a sensor to output or to operate between itself and the processing unit. Moreover, its main controller for monitoring and controlling the overall operation of the apparatus is connected with or without a wire to each unit controller and similarly sends or receives signals for directing a sensor to output or to operate. At the same time, the main controller is structured to monitor and control the operation of the processing unit through each unit controller.

Figure 3:
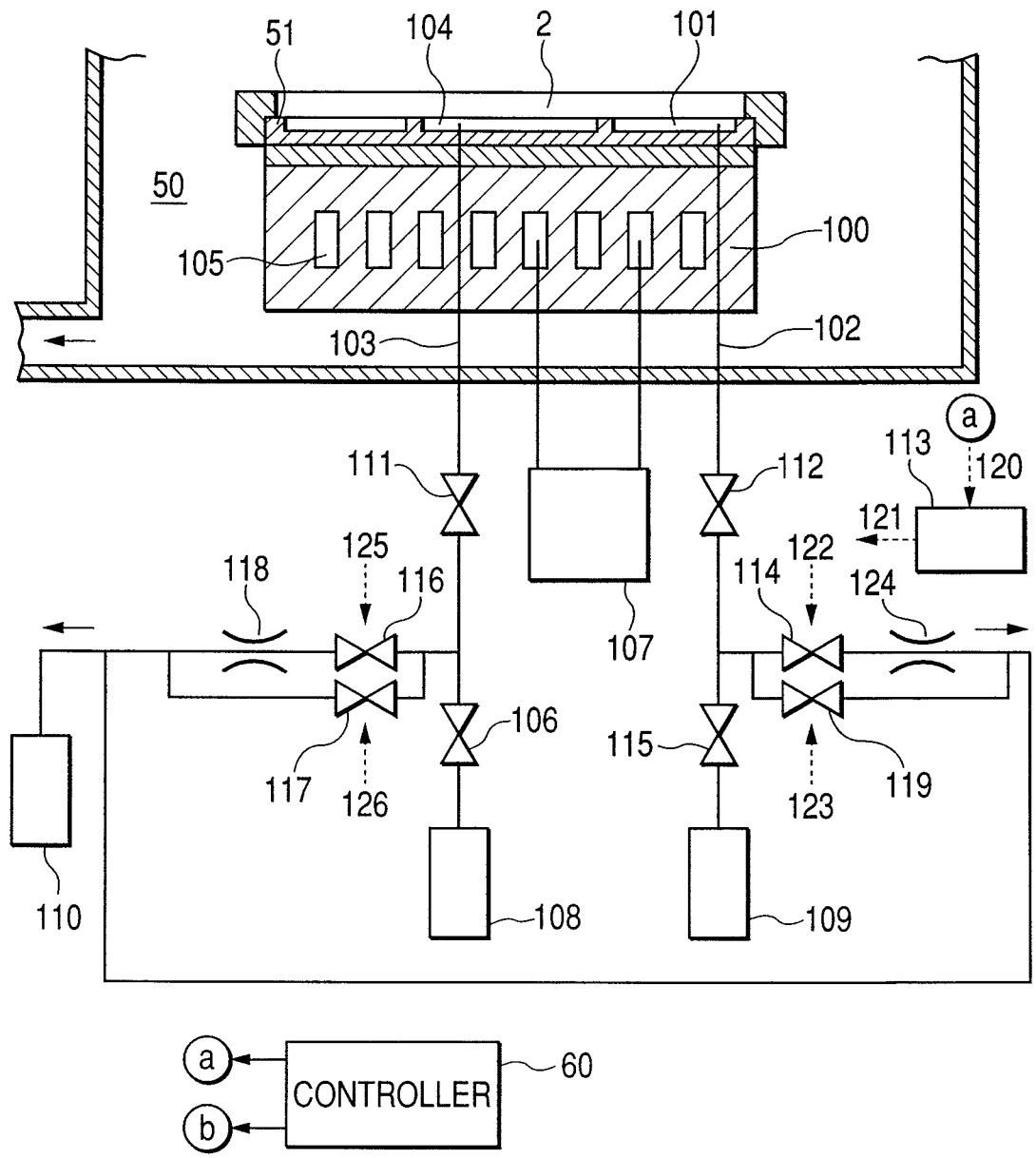
FIG. 3 is a schematic view illustrating a temperature control system of a sample according to the one example of the present invention.

FIG. 3 is a vertical cross-sectional view illustrating, in full detail, the constitution of the sample holder 100 as illustrated in FIG. 1, especially, the constitution related to a heat-conducting-gas pressure control function. In this drawing, a refrigerant channel 105 of the sample holder 100 is connected, at one end thereof, to the feed side of a temperature controller 107 via the channel and, at the other end, to the collection side of the temperature controller 107 via the channel.

The sample holder 100 has, on the surface thereof, two heat conducting gas regions. More specifically, the sample holder 100 has, on the center thereof, a first refrigerant channel 104 and, on the outer periphery, a second refrigerant channel 101. These first and second refrigerant channels are placed to control the temperature of the surface of the substantially cylindrical sample holder 100 on which the sample 2 is to be placed so as to provide proper temperature distribution across the surface of the sample 2. In this example, the first and second refrigerant channels have, for example, a concentric structure so that the sample 2 or sample holder 100 can be set at a desired plurality of temperatures in a radial direction thereof and can be set at a substantially equal temperature in a circumferential direction, whereby a difference of the surface of the sample 2 in the shape or degree as the results of processing given to the surface of the sample 2 can be suppressed.

With regards to the position of the heat conducting gas channel in the radial direction, the first heat conducting gas region 104 is within from 0 to 140 mm in radius from the center of the sample mounting surface of the sample holder 100 and the second heat conducting gas region 101 is within from 75 to 150 mm in radius from the center of the sample mounting surface.

The first heat conducting gas region 104 is connected, at one end thereof, to the supply side of a heat conducting gas canister 108 via the channel 103, valve 111 and pressure control valve 106, and is, at the other end, connected to a roughing pump 110 via sequence control valves 116, 117 and orifice 118 to discharge the gas.

The second heat conducting gas region 101 is connected, at one end thereof, to the supply side of a heat conducting gas canister 109 via the channel 102, valve 112 and pressure control valve 115 and is connected, at the other end, to the roughing pump 110 via sequence control valves 114, 119 and orifice 124 to discharge the gas. Indicated at numeral 113 is a sequencer controlled by the controller 60 and outputs valve opening setpoint signals 121, 122, 123, 125 and 126 which indicate the opening degree of the valves, respectively. When the output detected by a temperature sensor is different from a predetermined value by at least a certain value, the controller 60 having a microcomputer controls the operation of each valve by calculating an amount necessary for pressure change and issuing an order to the sequencer 113 to control each valve. In this manner, the output of the temperature detected by a temperature sensor is fed back to the operation of each valve through the sequencer 113.

By the heat-conducting-gas pressure control function, temperature distribution is controlled to a predetermined value, depending on the distribution of reaction products produced during the plasma processing of the sample. The absolute value of the temperature is controlled, depending on the progress of the sample processing.

First, when processing of a portion of the sample which produces much reaction products is conducted, the temperature distribution is controlled by raising the temperature of the sample holder to suppress re-deposition of the reaction products, and making uniform the processing rate of the whole sample. For example, when the distribution is such that the reaction products are produced much at the center of the sample and gradually decrease toward the periphery of the sample, the temperature distribution of the sample holder 100 is controlled to be high at the center and be gradually lowered toward the periphery.

The refrigerant subjected to temperature control in the temperature controller 107 is introduced into a channel. By the flow of the refrigerant through the refrigerant channel 105, the sample holder 100 is controlled to a preset temperature. The refrigerant returns from the channel to the temperature controller 107, by which it is heated or cooled to a predetermined temperature and then, it is introduced into the channel again.

The refrigerant thus introduced into the sample holder 100 passes through a fixed region, under goes a temperature change by the temperature controller 107 and is then introduced into the sample holder 100 again. The temperature of the sample holder is uniform with in the plane. A difference in the pressure between the backside gas regions 101 and 104 of the sample 2 leads to a difference in the conduction of a substrate bias to the sample holder, whereby the sample temperature is controlled to have a predetermined temperature distribution. A signal line 120 is used for reading the pressure of a built-in pressure gauge of the pressure control valve and when a certain deviation occurs relative to the preset value, the sequencer 113 sends preset signals 121, 122, 123, 125 and 126 indicating a valve opening degree to give a predetermined pressure in response to the deviation. Valves 114, 116, 117, 119 and the like repeat ON/OFF in response to these preset signals. In other words, stepwise change between opening and closing or from optional opening degree to another opening degree is repeated.

In order to control the temperature, the pressure of an He gas fed between the sample mounting surface and backside surface of the sample is reduced stepwise depending on the progress of the processing of films constituting a plurality of layers of the sample. The opening degree of each of the valves 116, 117, 119 and 122 placed on an exhaust channel, which is communicated with introduction channels 102, 103 through which the He gas is fed onto the sample mounting surface, for discharging a heat conducting gas in the introduction channel by the roughing pump 110 is adjusted stepwise.

Figure 4:
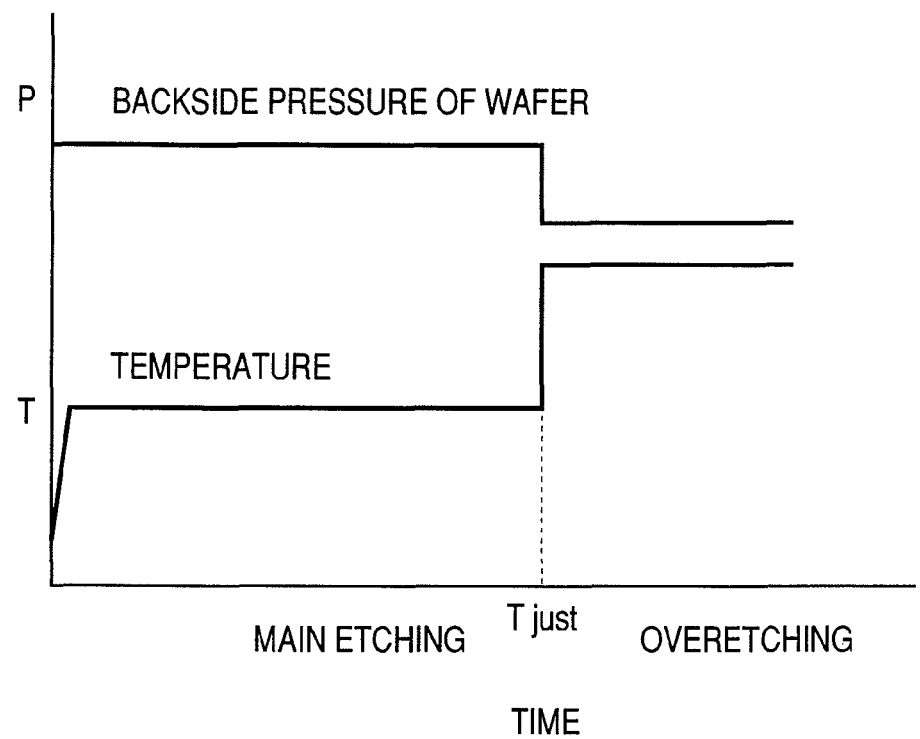
FIG. 4 is a schematic view illustrating control patterns of a backside pressure control, depending on a difference in etching mode, according to the one example of the present invention.

FIG. 4 illustrates a specific example of the stepwise reduction of an He gas pressure in accordance with the progress of the processing of films constituting a plurality of layers of the sample. In FIG. 4, the backside pressure of the sample is changed to P1 during main etching and P2 (P2<P1) during overetching. By reducing the backside pressure of the sample in accordance with the progress of the processing, the sample temperature in the backside gas region increases to high temperature during overetching. In the final stage of etching into a desired shape, this makes it possible to enhance the transport capacity of deposits (reaction products) and to form an etched shape with a higher aspect ratio. A reduction in the backside pressure from P1 during main etching to P2 during overetching is carried out in the vicinity of the interface. A reduction in the pressure of a heat conducting gas on the backside may be carried out either after or just before the main etching reaches the interface of the film.

With regards to the reduction in the backside pressure, smooth pressure reduction is attained using two roughing lines, that is, a roughing line through an orifice-less channel, that is, through the valve 117 and a roughing line through the valve 119.

The valves 117 and 119 are controlled by an ON/OFF signal based on the control signal (a) provided by the controller 60. A fine tuning line arranged in the order of valve 114, orifice 124 and roughing pump 110 and another fine tuning line arranged in the order of valve 116, orifice 118 and roughing pump 110 are used properly when a flow rate as small as the leakage of the backside gas from a high-pressure backside region to a low-pressure backside region is roughed. Proper use between the roughing line and fine tuning line and pressure reduction by them are controlled by the sequencer 113 in accordance with the progress of the processing of the films constituting a plurality of layers of the sample.

Figure 5:
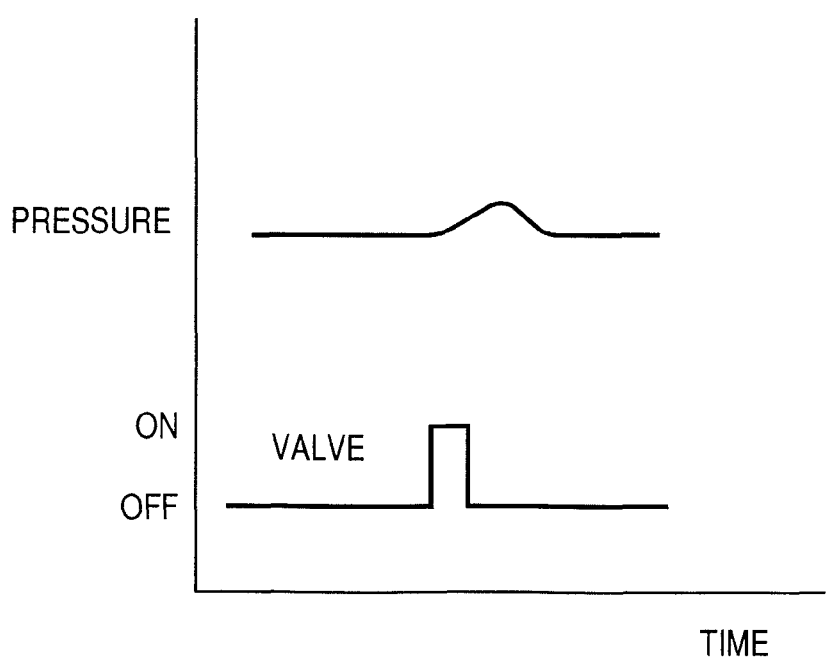
FIG. 5 is a schematic view illustrating the characteristics during backside pressure control when an etching mode is switched, according to the one example of the present invention.

FIG. 5 illustrates a relation between an ON/OFF time of preset signals of these valves 117 and 119 and response thereto of the backside pressure of the sample. In this Embodiment, the valves 117 and 119 are operated so as to switch stepwise from a closed state to an open state in order to reduce the gas pressure on the backside of the sample. This enables a drastic change in the gas pressure on the backside of the sample.

Figure 6:
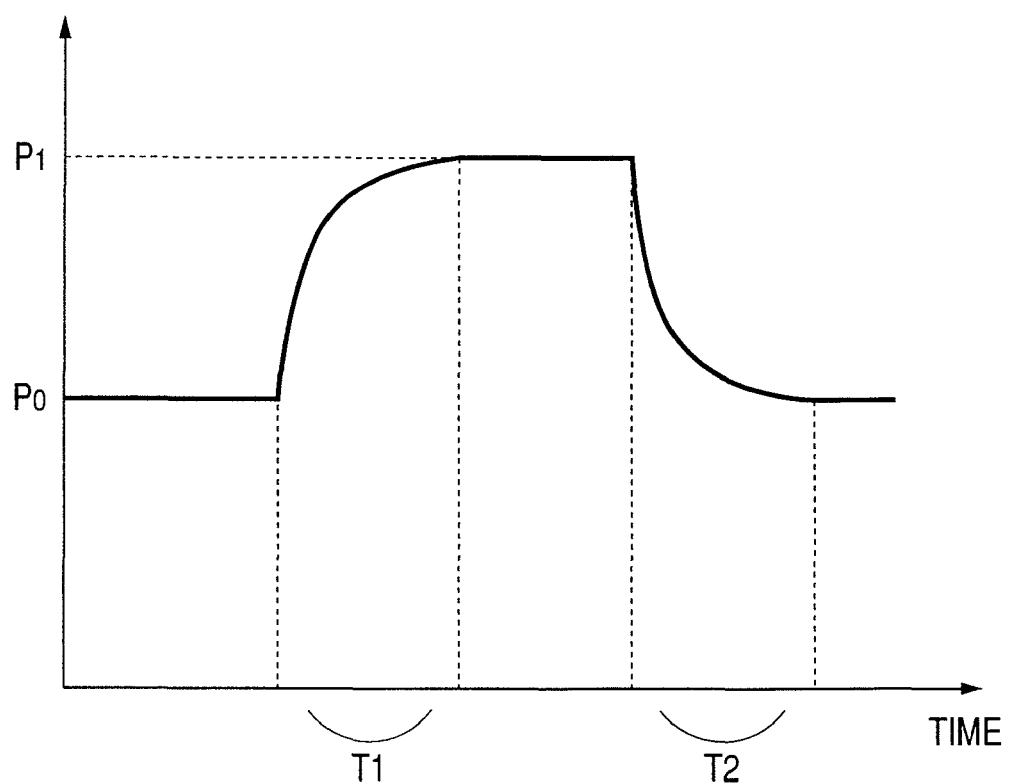
FIG. 6 illustrates one example of the back side gas pressure measurement results according to the one example of the present invention.

FIG. 6 is an enlarged view of the actually measured pressure on the backside of the sample. A response time T1 of pressure change is that from transmission of a signal for opening the valve 117 or 119 until the pressure ($P_0$ at the beginning) of a heat conducting gas in the region 104 or 101 reaches a predetermined value $P_1$. A response time T2 of is that from transmission of signals for closing the valve 117 or 119 until the pressure of a heat conducting gas in the region 104 or 101 reaches $P_0$. It has been confirmed that the response time T1 or T2 of pressure change can be decreased adequately relative to etching time. The operation of the valve 117 or 119 in this Embodiment thus enables drastic and stepwise change of gas pressure of the region 104 or 101.

On the interface between different film layers, processing when the underlying layer is exposed is required to be switched in a shorter time. According to this example, processing conditions such as temperature on the interface between two different layers and in the vicinity thereof can be changed promptly.

Figure 7A:
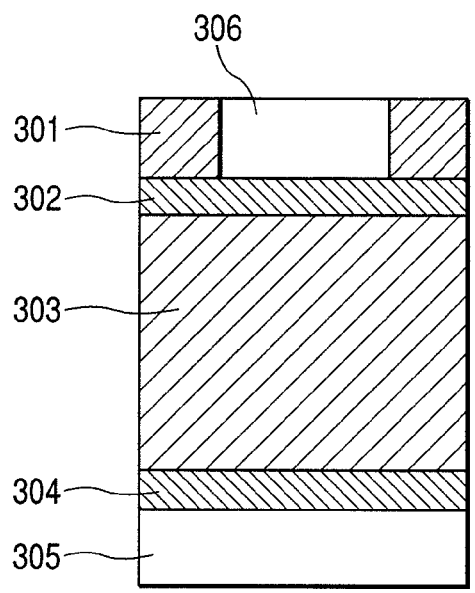
FIGS. 7A to 7D illustrate the relationship between an etching mode and the cross-sectional structure of a material to be etched, according to the one example of the present invention.
Figure 7B:
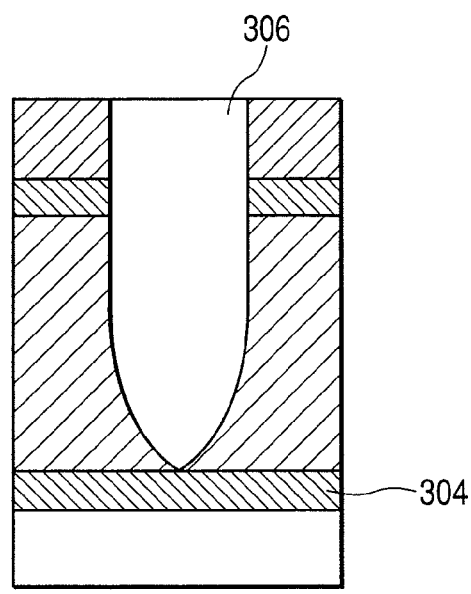
Figure 7C:
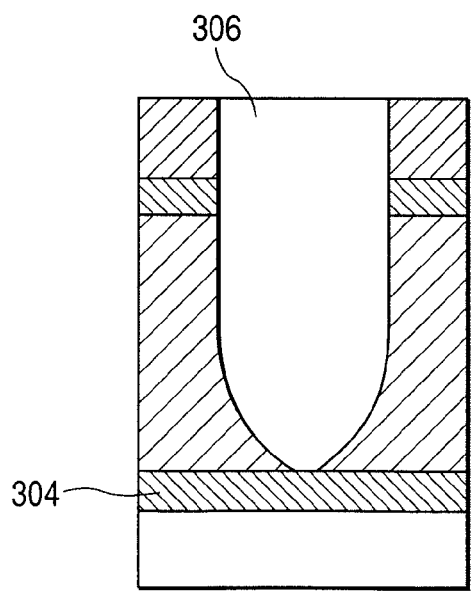
Figure 7D:
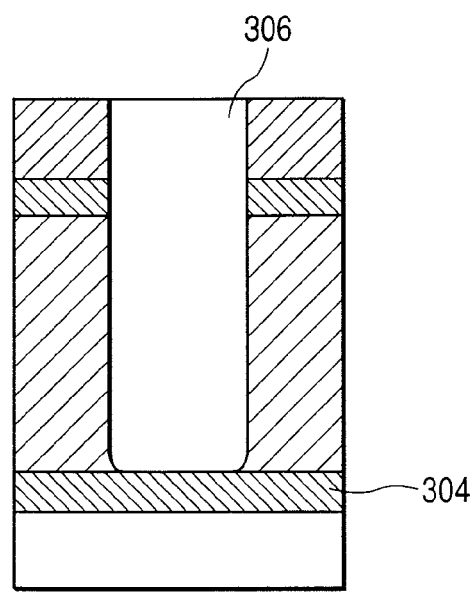

FIGS. 7A to 7D include schematic view so fan etching example shown in accordance with the progress of etching of films constituting a plurality of layers of the sample. As one example, a multilayer film laid over the sample is composed of photoresist mask 301, antireflective film 302, oxide film (for example, $SiO_2$) 303, etching stopper film (for example, SiN) 304, and a silicon substrate (Si) 305. As illustrated in FIG. 7A, a mask pattern (hole) 306 of a desired size is formed from the resist 301 on the surface of the sample. By main etching using a $CF_4$ gas, a contact hole is etched along the mask pattern. This main etching step employs a processing gas suited for etching, mainly anisotropic etching, to heighten an oxide film/resist selectivity. As a result, as illustrated in FIG. 7B, the resist almost remains without being etched, but the oxide film is etched much, which shortens the etching time to reach the stopper film. After a terminal point judging function detects that the etching reaches the stopper film (FIG. 7B), the main etching step is switched to an overetching step. In this overetching step, etching conditions are changed to permit a low oxide film/resist selectivity and a high oxide film/stopper film selectivity. By overetching, the photoresist is removed by etching, mainly isotropic etching, in which the resist is etched much but the oxide film almost remains without being etched. With regards to the relation between oxide film and stopper film, the conditions are changed to permit much etching of the oxide film but no etching of the stopper film. In such a manner, a highly precise contact hole (or trench) 306 as illustrated in FIG. 7D, which hole corresponds to the mask pattern, can be formed in a short time.

FIGS. 8A and 8B illustrates examples of the relation between the sample temperature and processed shape when the step is switched from main etching to overetching. When the sample temperature is high, the pattern becomes as illustrated in FIG. 8A, that is, the entire hole 306 is covered with a film (protecting film) 801 of reaction products. A temperature increase reduces the adhesion coefficient of the reaction products, whereby the reaction products are carried down to the bottom of the hole 306. In not only the main etching step but also in the overetching step, the protecting film of reaction products is formed. This becomes a protecting film for an underlying etching stopper film, increases the defect prevention effect and increases an aspect ratio of the etched shape.

When the sample temperature becomes low, a film 802 of reaction products does not protect the underlying film as illustrated in FIG. 8B, which owes to an increase in the adhesion coefficient of reaction products. As a result, the film of reaction products is carried only to the vicinity of the upper surface of the whole 306. The underlying etching stopper film is therefore etched, which will be a cause for defects. In addition, the aspect ratio of the hole becomes small.

FIG. 9 shows the actual measurement results of the dependence of the processed shape, that is, an oxide film/resist selectivity of the sample on the temperature. The measurement is conducted while changing the temperature of TCR (temperature controller). The sample temperature follows it and becomes a little higher than the refrigerant temperature, influenced by a heat conductivity of sample holder or backside gas. The measurement is however based on TCR temperature so that it is used as a substitute for the sample temperature.

Figure 10A:
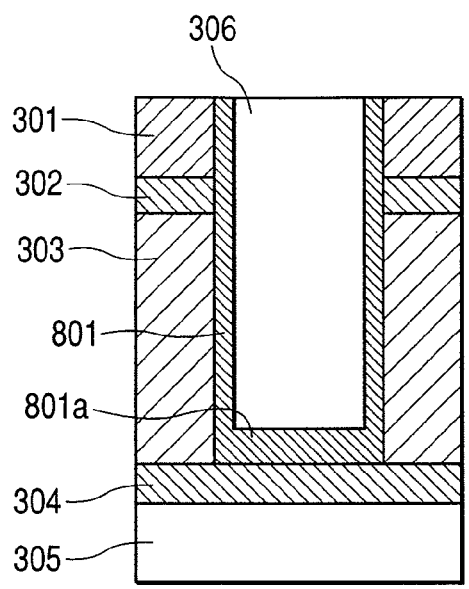
FIGS. 10A and 10B are explanatory views of the effect according to the one example of the present invention.

With an increase in the sample temperature, the oxide film/resist selectivity decreases. The gas pressure on the backside of the sample is reduced stepwise as illustrated in FIG. 4 by the heat-conducting-gas pressure control function when the main etching comes to an end or comes near to the end. This makes it possible to increase a ratio of the etching amount of the resist, enhances a transport capacity of deposits (reaction products), and thickens the protecting film 801a of the underlying etching stopper film as illustrated in FIG. 10A. According to this example, these actions can be developed promptly.

By the formation of the protecting film, etching of the underlying etching stopper film can be prevented and defect prevention and an increase in the aspect ratio of an etched shape can be attained. In this example, excessive etching of the underlying etching stopper film or impossibility of high precision processing of an oxide film into a desired shape which will otherwise occur owing to variations in the conditions until switch-over can be prevented.

Deterioration in the processing efficiency or throughput can be prevented because there is no necessity of reducing the processing speed during exposure of an etching stopper film or in advance thereof.

Figure 10B:
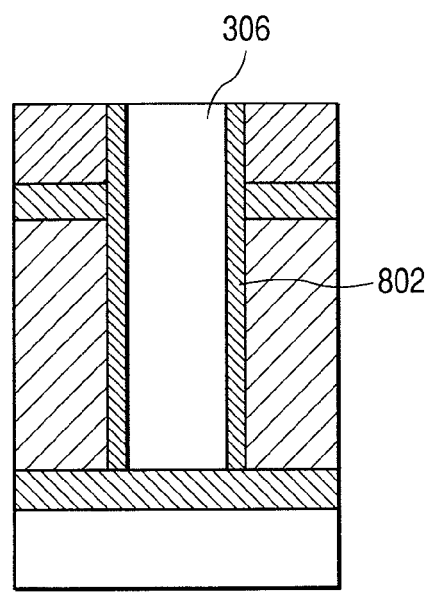

FIG. 10B is illustrated for comparison. When the pressure of the backside gas of the sample is not changed, an adhesion coefficient of reaction products increases. The deposit is carried only to the vicinity of the upper surface of the hole 306 and the underlying etching stopper film is etched to become a cause for defects and at the same time, an aspect ratio decreases.

When films constituting a plurality of layers are etched into a predetermined shape, this example is thus effective for controlling the shape of the sample with high precision, eliminating the deficiency in shape in the sample processing, and processing the shape into that with a high aspect ratio. It is also effective, when films constituting a plurality of layers are etched into a predetermined shape, this example is effective for improving the throughput of the processing.

The switch-over of the processing conditions on the interface between different film layers may be conducted only by the heat-conducting-gas pressure control function or substrate bias control function, depending on the kind of the film or processing conditions.

Second Example

The second example of the present invention will next be described.

In the first example, the switch-over of the transport capacity of deposits (reaction products) is carried out by a heat-conducting-gas pressure control function. The transport capacity of deposits (reaction products) can be controlled by a substrate bias control function, which corresponds to the second example. In this case, the switch-over of the substrate bias is carried out in the vicinity of the interface of films.

After the protecting film reaches the bottom, the substrate bias itself is heightened, whereby the transport capacity of deposits (reaction products) in the hole can be enhanced. An increase in the substrate bias disturbs etching of a resist but accelerates etching of an oxide film. Similar to the reaction products illustrated in FIG. 10A, the reaction products are carried down to the bottom of the hole 306. On the interface between different film layers, the switch-over of processing in a shorter time is requested when the underlying layer is exposed. The switch-over of the substrate bias enables smooth change of processing conditions on the interface between different film layers.

The reaction products thus forms a protecting film in an overetching step. It enhances a defect preventing effect and at the same time, heightens an aspect ratio of the etched shape, as a protecting film of the underlying etching stopper film.

Figure 11:
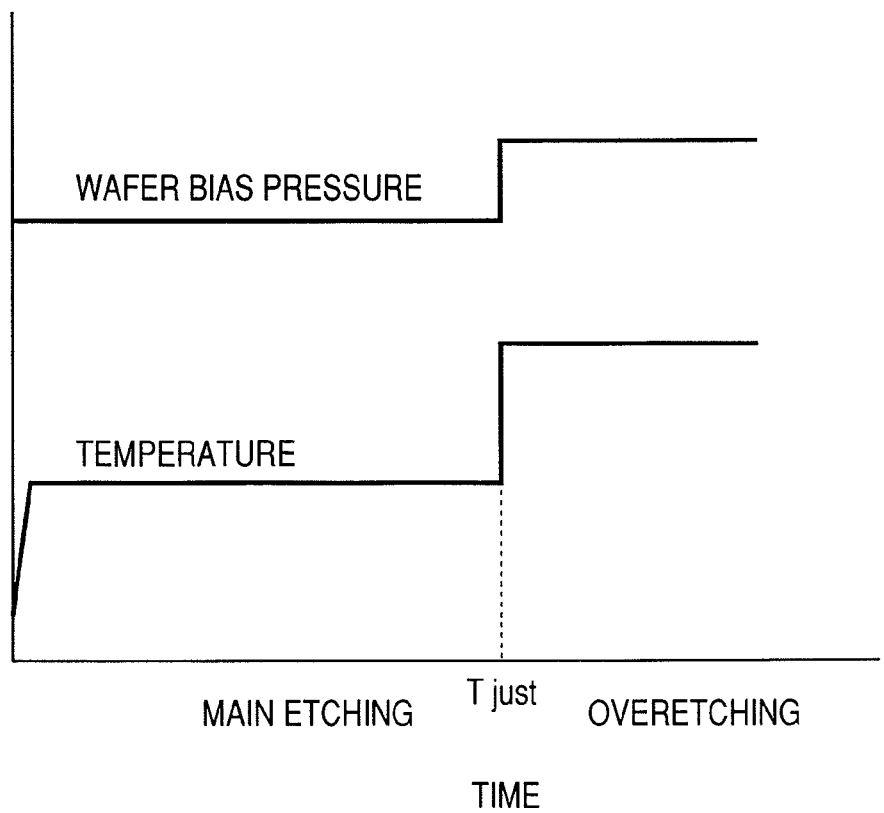
FIG. 11 is a schematic view illustrating the difference in substrate bias control owing to a difference in etching mode, according to another example of the present invention.
Figure 12A:
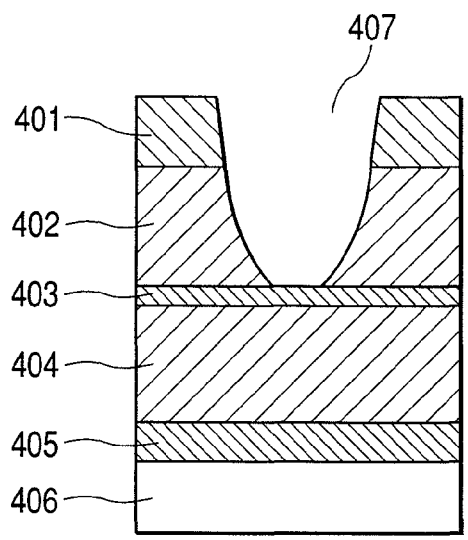
FIGS. 12A to 12D illustrate a relationship between an etching mode and a cross-sectional structure of a material to be etched, according to a further example of the present invention.
Figure 12B:
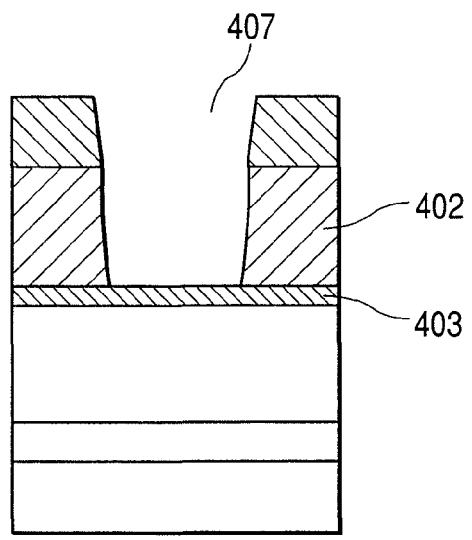
Figure 12C:
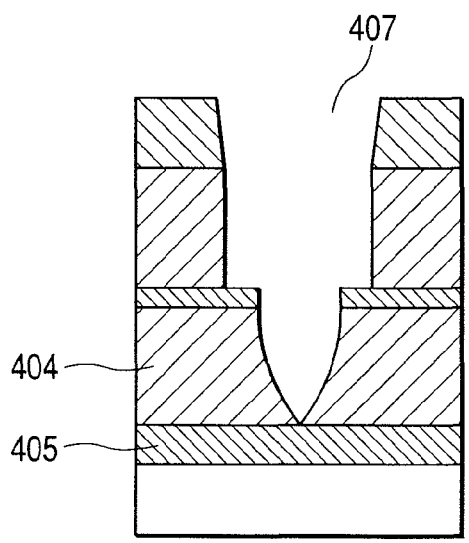
Figure 12D:
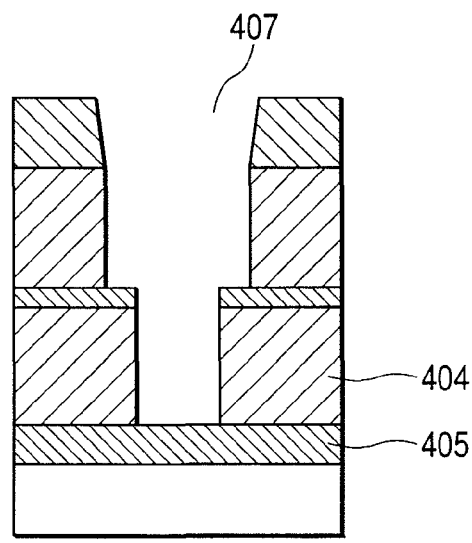

As illustrated in FIG. 11, after the protecting film reaches the bottom, the gas pressure on the backside of the sample is reduced by the heat-conducting-gas pressure control function. At the same time, the substrate bias is heightened by the substrate bias control function to promote incidence of charged particles formed in the plasma onto the surface of the sample, thereby causing brisk reaction between the sample surface and the particles in plasma excited to high energy levels. Processing can therefore be carried out to provide a higher aspect ratio. This leads to shortening of the throughput, because an etched amount of an oxide film during main etching can be increased.

This example is thus effective for controlling the shape of the sample with high precision, eliminate deficiency in shape in the sample processing and process the shape into that with a high aspect ratio when films constituting a plurality of layers are etched into a predetermined shape. In addition, when films constituting a plurality of layers are processed into a predetermined shape, this example is effective for improving the throughput of the processing.

Third Example

The present invention can be applied to the etching of a multilayer film having a damascene structure. For example, when a first stopper layer 403 exists between a first oxide film 402 and a second oxide film 404 as illustrated in FIGS. 12A to 12D, a hole 407 is formed (illustrated in FIGS. 12A and 12B) by etching the first oxide film along a mask pattern of a resist 401 under similar conditions to those employed in the main etching step of the above-described embodiment, processing the first stopper layer 403 (illustrated in FIG. 12C) under similar conditions to those employed in the overetching step, and then successively processing the second oxide film 404 and etching stopper film 405 under conditions of the main etching step and overetching step. According to this example, it is possible to prevent such problems as excessive etching of the stopper layer 403 or etching stopper film 405, or impossibility of obtaining a desired shape in the main etching step because of variations in the conditions until switch-over.

In addition, a reduction in the processing efficiency or throughput can be prevented, because there is no need of lowering a processing rate during the exposure of the stopper layer or prior thereto.

The present invention can also be applied to the etching of a multilayer film having a damascene structure when no stopper layer exists between the first and second films.

Figure 13:
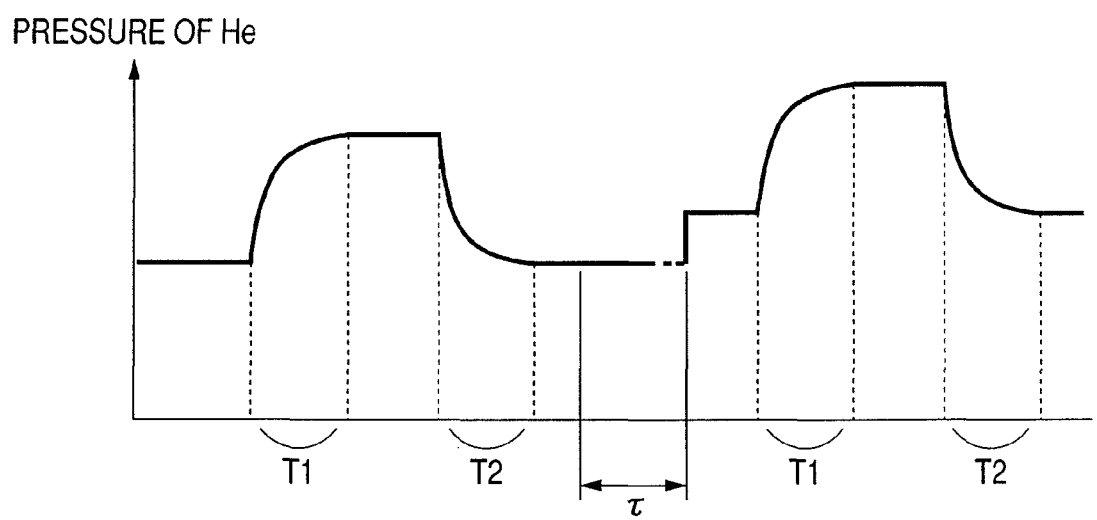
FIG. 13 illustrates one example of the backside gas pressure measurement results according to the further example of the present invention.

For example, as illustrated in FIG. 13, the first film is processed using a processing pattern of the first film permitting rapid processing into a high precision shape and after an elapse of time τ, the second film is processed using a processing pattern of the second film permitting rapid processing into a high precision shape. On the interface between different film layers, switch-over of the processing in a shorter time when the underlying layer is exposed is demanded. According to this example, it is possible to prevent such problems as excessive etching of the underlying film and impossibility of obtaining a desired shape because of variations in the conditions until switch-over.

In addition, a reduction in the processing efficiency or throughput can be prevented, because there is no need of lowering a processing rate during the exposure of the underlying layer or in advance thereof.

Fourth Example

Figure 14:
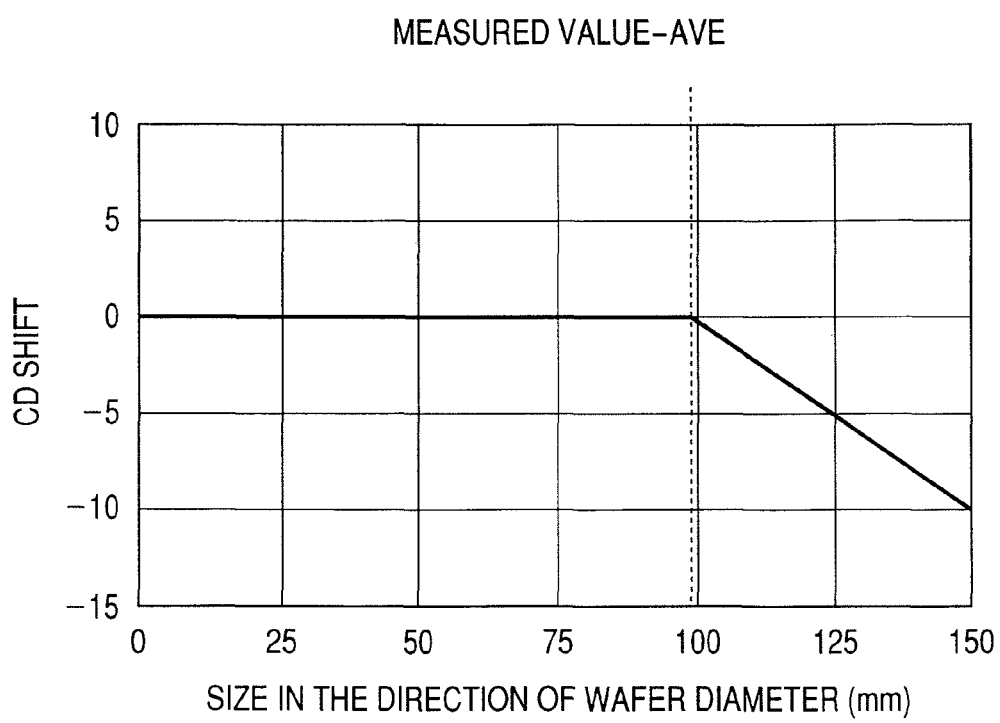
FIG. 14 is a graph showing the distribution of shapes of the sample after processing, in examples of the present invention.

An example of the target (desired) temperature distribution of the above-described examples of the present invention is shown in FIG. 14. In this graph, the surface temperature of the sample 2 continues to be flat until a position on a certain radius from the center of the sample. With the position on a certain radius as a sharp inflection point, the temperature shows a decrease in proportion to the radius on positions outside the radius as the inflection point. The temperature distribution on the surface of the sample 2 is controlled in accordance with the distribution of the shape of the sample after processing, and relationship among the shape of the sample after processing, temperature of the refrigerant or sample holder, and bias voltage.

Figure 15:
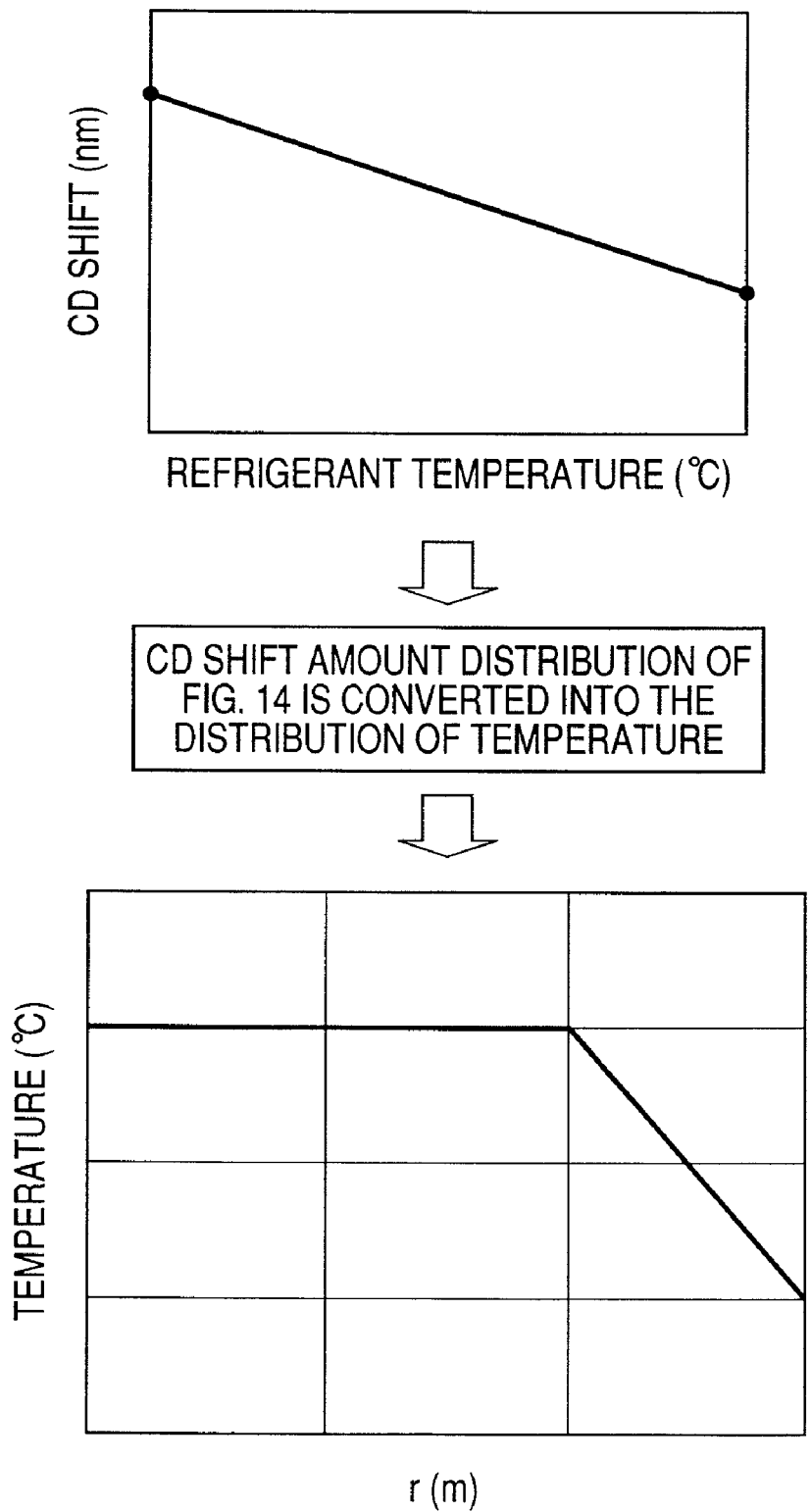
FIG. 15 is a graph illustrating the relationship between the shape of the sample after processing and desired temperature distribution of a supple holder or the positional relationship from the center of the sample.

With regards to the distribution of the surface temperature of the sample 2, temperatures are determined by the user of the apparatus based on the distribution of the reaction products produced on the surface of the sample 2 during plasma processing. Such a relationship will next be described using a graph as illustrated in FIG. 15.

For example, when the reaction products are produced much on the center side and their amount gradually decreases toward the periphery of the sample 2, the surface shape of the sample 2 to be etched depends on the amount or density of the reaction products.

The CD shift amount does not show the uniform in-plane distribution of the sample owing to factors such as distribution of plasma density caused by generation of plasma and evacuation flow. In this case, the refrigerant temperature and heat conducting gas pressure or substrate bias may be set depending on the sample in-plane change of the CD shift amount.

Since a portion with a small CD shift amount is presumed to have a high sample temperature and be resistant to redeposition of reaction products, the sample temperature is decreased by adjusting the refrigerant temperature and pressure of a heat conducting He gas or substrate bias voltage. The CD shift difference within the sample plane can therefore be reduced and the distribution can be improved.

In the above-described example, the sample holder 100 has, on the surface thereof, two annular heat conducting gas regions. The present invention is not limited thereto. For example, the sample holder 100 may have, on the surface thereof, three annular regions as a region fed with He. A heat conducting gas is fed to each of these heat conducting gas regions through a channel. A first heat conducting gas region is placed within 0 to 75 mm, a second heat conducting gas region is placed within 75 to 135 mm and a third heat conducting gas region is placed within 135 to 150 mm, each in a radial direction from the center of the sample holder 100. Such a constitution enables more delicate control. The valves 117 and 119 are each opened or closed by an ON/OFF order signal from the sequencer 113. Alternatively, they may be switched to certain opening degrees which are different from each other. Instead of such operations of these valves, a gas pressure on the backside of the sample may be changed promptly by making the opening degrees of orifices 116 and 124 switchable.

In the above-described examples, plasma etching apparatuses were described. The present invention however can be applied widely to processing apparatuses for processing a sample or the like in a reduced pressure atmosphere while heating. Examples of a processing apparatus utilizing plasma include plasma etching apparatus, plasma CVD apparatus, and sputtering apparatus. Examples of the processing apparatus without utilizing plasma include apparatuses for ion implantation, MBE, vapor deposition and reduced pressure CVD.

What is claimed is:

1. A vacuum processing method using a vacuum processing apparatus comprising a vacuum container having an interior which is depressurizable, a sample holder placed in the vacuum container and having a sample mounting surface where a sample to be processed is mounted thereon, an introduction channel for supplying a heat conductive gas to a region between the sample mounting surface and a back side of the sample when the sample is mounted thereon, and plural exhaust channels coupled to a roughing exhaust pump for discharging and reducing a pressure of the heat conducting gas in the region, the method comprising steps of:

mounting a sample on the sample mounting surface on the sample holder;

feeding a processing gas and applying an electric field to a space above the sample holder inside of the vacuum container so as to generate plasma; and etching films of a plurality of layers laid over the surface of the sample into a predetermined shape, at least of one layer of the films being etched while supplying the heat conductive gas in the region between the sample mounting surface and the back side of the sample mounted thereon;

wherein the plural exhaust channels include a smooth reduction line through which the heat conducting gas is discharged smoothly and a fine tuning line having an orifice through which the heat conductive gas is discharged in a small flow rate; and wherein, in accordance with the progress of the etching of the films, a valve in the smooth reduction line is operated stepwise, and the discharge of the heat conductive gas through the smooth reduction line and the pressure of the heat conductive gas in the region is reduced stepwise.

2. A vacuum processing method according to claim 1, wherein the films constituting the plurality layers have a damascene structure.

3. A vacuum processing method according to claim 1, wherein the plural exhaust channels are connected to a middle of the introduction channel, and, during the etching of the films, the pressure of the heat conducting gas in a portion of the introduction channel is decreased stepwise.

4. A vacuum processing method according to claim 3, wherein the films constituting the plurality of layers have a damascene structure.

5. A vacuum processing method according to claim 1, wherein the pressure is reduced stepwise when the etching of the films reaches a vicinity of a interface between the films of the plurality of layers.

6. A vacuum processing method according to claim 5, wherein the films constituting the plurality of layers have a damascene structure.

7. A vacuum processing method according to claim 5, wherein the plural exhaust channels are connected to a middle of the introduction channel, and, during the etching of the films, the pressure of the heat conducting gas in a portion of the introduction channel is decreased stepwise.

8. A vacuum processing method according to claim 7, wherein the films constituting the plurality of layers have a damascene structure.

* * * * *